(12) United States Patent
Thomson et al.

(10) Patent No.: US 10,042,789 B2
(45) Date of Patent: Aug. 7, 2018

(54) PROGRAMMING INTERRUPTION MANAGEMENT

(71) Applicant: Micron Technology, Inc., Boise, ID (US)

(72) Inventors: Preston A. Thomson, Kuna, ID (US); Kishore K. Muchherla, San Jose, CA (US); Sampath K. Ratnam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 548 days.

(21) Appl. No.: 14/662,280

(22) Filed: Mar. 19, 2015

(65) Prior Publication Data

US 2016/0117272 A1 Apr. 28, 2016

Related U.S. Application Data

(60) Provisional application No. 62/069,077, filed on Oct. 27, 2014.

(51) Int. Cl.
*G06F 13/00* (2006.01)
*G06F 13/24* (2006.01)
*G11C 16/04* (2006.01)
*G11C 16/10* (2006.01)
*G06F 11/14* (2006.01)

(52) U.S. Cl.
CPC .......... *G06F 13/24* (2013.01); *G11C 16/0483* (2013.01); *G06F 11/1405* (2013.01); *G11C 16/102* (2013.01)

(58) Field of Classification Search
CPC .............................. G06F 11/1405; G06F 13/24
See application file for complete search history.

(56) References Cited

U.S. PATENT DOCUMENTS

| | | | |
|---|---|---|---|
| 8,504,762 B2 | 8/2013 | Matsumoto et al. | |
| 8,554,990 B2 | 10/2013 | Kwon et al. | |
| 8,924,785 B2 | 12/2014 | Meir et al. | |
| 2004/0003327 A1 | 1/2004 | Joshi et al. | |
| 2006/0059326 A1 | 3/2006 | Aasheim et al. | |
| 2009/0327589 A1 | 12/2009 | Moshayedi | |
| 2012/0054582 A1* | 3/2012 | Byom | G11C 16/26 714/773 |
| 2014/0025874 A1 | 1/2014 | Kwon et al. | |
| 2014/0281683 A1* | 9/2014 | Dusija | G06F 11/0754 714/6.11 |

* cited by examiner

*Primary Examiner* — Zachary K Huson
(74) *Attorney, Agent, or Firm* — Brooks, Cameron & Huebsch, PLLC

(57) ABSTRACT

The present disclosure is related to programming interruption management. An apparatus can be configured to detect an interruption during a programming operation and modify the programming operation to program a portion of the memory array to an uncorrectable state in response to detecting the interruption.

30 Claims, 3 Drawing Sheets

PROGRAMMING INTERRUPTION MANAGEMENT

PRIORITY INFORMATION

This application claims priority to U.S. Provisional Application Ser. No. 62/069,077, filed Oct. 27, 2014.

TECHNICAL FIELD

The present disclosure relates generally to semiconductor memory and methods, and more particularly, to programming interruption management.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error data, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

As memory devices are programmed, interruptions to a programming operation can lead to unintended data states of memory cells in the memory devices. Memory cells in the memory devices that are being programmed when a programming operation is interrupted can be detected as being erased and/or as programmed to a data state that was not the intended data state. To address possible errors associated with programming operation interruptions, some memory devices may benefit from improved programming interruption management techniques.

DETAILED DESCRIPTION

Figure 1:
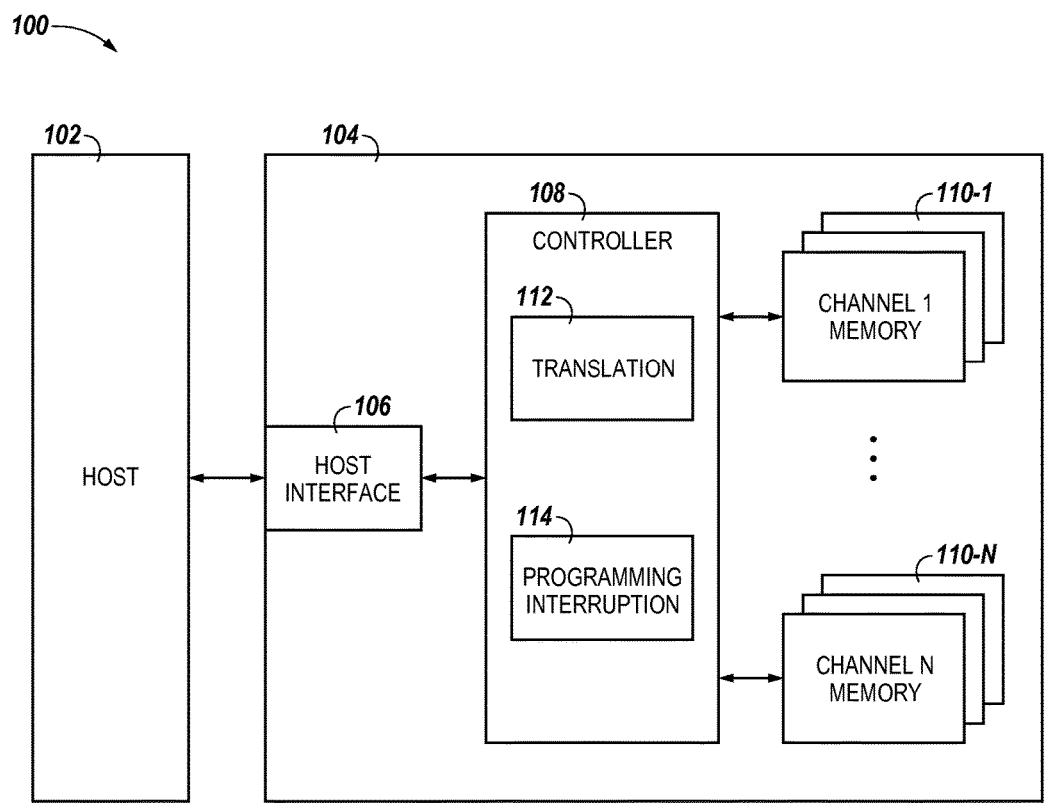
FIG. 1 is a block diagram of an apparatus in the form of a computing system including at least one memory system in accordance with a number of embodiments of the present disclosure.

The present disclosure is related to programming interruption management. An apparatus can be configured to detect an interruption during a programming operation and modify the programming operation to program a portion of the memory array to an uncorrectable state in response to detecting the interruption.

In a number of embodiments, programming interruption management can be used to detect a programming interruption and modify a programming operation in response to detecting a programming interruption. A programming interruption can be detected via a signal toggle using settings and/or trims in a controller that is internal or external to an apparatus, such as a memory system and/or memory device, among other apparatuses. For example, a write protect pin can be monitored and when a voltage level on the write protect pin drops below a threshold, a controller can modify a programming operation. A programming operation can be modified to program memory cells to an uncorrectable data state. For example, the pages in a memory device that were being programmed when a programming operation is interrupted can be programmed to an uncorrectable data state. When a programming operation is interrupted, the pages that were being programmed may be in an erased state and/or an intermediate state, such as a data state corresponding to a lower page programming operation and/or a middle page programming operation, for example, that was not an intended data state and/or final data state according to the programming operation. Therefore, errors may occur when the data on those pages is accessed, e.g., read. Programming interruption management can intentionally corrupt the pages and/or codewords that were being programmed when a programming operation is interrupted so that those pages and/or codewords will be detected by a controller as being corrupt.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 321 may reference element "21" in FIG. 3, and a similar element may be referenced as 421 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, . . . , 110-N (e.g., solid state memory devices such as NAND flash devices), which provide a storage volume for the memory system 104. The memory system 104 can be a single memory device.

As illustrated in FIG. 1, the controller 108 can be coupled to the host interface 106 and to the memory devices 110-1, . . . , 110-N via a plurality of channels and can be used to send data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., having an on-die controller).

The controller 108 can communicate with the memory devices 110-1, . . . , 110-N to control data read, write, and erase operations, among other operations. The memory devices 110-1, . . . , 110-N can be a plurality of memory arrays on a single die, a plurality of memory arrays on multiple dies, or a single memory array on a single die. The controller 108 can be on the same die or a different die than any or all of the memory devices 110-1, . . . , 110-N.

The arrays can be flash arrays with a NAND architecture or a NOR architecture, for example. However, embodiments are not limited to a particular type of memory array or array architecture. Although floating-gate type flash memory cells in a NAND architecture are generally referred to herein, embodiments are not so limited. Other examples include electrically erasable programmable ROM (EEPROM), erasable programmable ROM (EPROM), ferroelectric RAM (FRAM), and resistance variable memory such as phase change random access memory (PCRAM), resistive random access memory (RRAM), and magnetoresistive random access memory (MRAM), among others.

Although not specifically illustrated, in some embodiments, the controller 108 can include a discrete memory channel controller for each channel coupling the controller 108 to the memory devices 110-1, . . . , 110-N. The controller 108 can include, for example, a number of components in the form of hardware and/or firmware (e.g., a number of integrated circuits) and/or software for controlling access to the memory devices 110-1, . . . , 110-N and/or for facilitating data transfer between the host 102 and memory devices 110-1, . . . , 110-N.

The number of memory devices 110-1, . . . , 110-N can include a number of arrays of memory cells (e.g., non-volatile memory cells). The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory (e.g., memory devices 110-1, . . . , 110-N of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

As illustrated in FIG. 1, the controller 108 can include logical-to-physical translation circuitry 112 and programming interruption circuitry 114. Each of the logical-to-physical translation circuitry 112 and programming interruption circuitry 114 can be discrete components such as an application specific integrated circuit (ASIC) or the components may reflect functionality provided by circuitry and/or executable instructions within the controller 108 that does not necessarily have a discrete physical form separate from other portions of the controller 108. Although illustrated as components within the controller 108 in FIG. 1, each of the logical-to-physical translation circuitry 112 and programming interruption circuitry 114 can be external to the controller 108 or have a number of components located within the controller 108 and a number of components located external to the controller 108. The functionality described herein as being implemented by the controller 108 (e.g., by the logical-to-physical translation circuitry 112 and/or the programming interruption circuitry 114) can be provided as a non-transitory electronic device readable medium storing instructions executable by the electronic device (e.g., firmware in the controller 108) to provide the functionality.

The logical-to-physical translation circuitry 112 can be used to convert between host and/or file system addresses and memory addresses. In some embodiments, the logical-to-physical translation circuitry 112 can include a flash translation layer (FTL). The logical-to-physical translation circuitry 112 can be used (e.g., during a programming operation performed on the memory devices 110-1, . . . , 110-N) to map a logical address associated with a data entry to a physical address in the memory devices 110-1, . . . , 110-N. The logical-to-physical translation circuitry 112 may include an address mapping table in the local memory of the controller 108 to perform the mapping operation. A host 102 can use logical block addresses (LBAs) when addressing a memory system 104. The logical-to-physical translation circuitry 112 can translate an LBA to a physical location in the memory devices 110-1, . . . , 110-N, and vice versa. This allows the host 102 to ignore the physical characteristics of the memory devices 110-1, . . . , 110-N and treat the memory system 104 as a contiguous linear map of logical sectors. Each host operation can be translated into a single or multi-sector memory operation.

The programming interruption circuitry 114 can be used to detect a programming interruption and modify a programming operation in response to detecting a programming interruption. The programming interruption circuitry 114 can detect a programming interruption via a signal toggle using settings and/or trims on a controller. For example, a write protect pin can be monitored and when a voltage level on the write protect pin drops below a threshold, the controller can modify a programming operation. The programming interruption circuitry 114 can modify a programming operation by programming memory cells to an uncorrectable data state. For example, the pages in a memory device that were being programmed when a programming operation is interrupted can be programmed to an uncorrectable data state. When a programming operation is interrupted, the pages that were being programmed may be in an erased state and/or an intermediate state that was not the intended state according to the programming operation. Therefore, the memory cells of these pages may be cause errors to occur when the data on those pages is accessed. The programming interruption circuitry 114 can intentionally corrupt the pages that were being programmed when a programming operation is interrupted so that those pages will be detected by the controller as being corrupt and the data intended for those pages can be written during another programming operation at another location in a memory device.

The memory system 104 can implement wear leveling (e.g., garbage collection and/or reclamation) to handle the pages and blocks that include the memory cells on the memory devices 110-1, . . . , 110-N programmed to the uncorrectable state. Wear leveling can include dynamic wear leveling to minimize the amount of valid blocks moved to reclaim a block. Dynamic wear leveling can include a technique called garbage collection. Garbage collection can include reclaiming (e.g., erasing and making available for writing) blocks that have the most invalid pages (e.g., according to a "greedy algorithm"). Alternatively, garbage collection can include reclaiming blocks with more than a threshold amount of invalid pages. If sufficient free blocks exist for a writing operation, then a garbage collection operation may not occur. An invalid page, for example, can be a page of information that has been updated to a different page. Static wear leveling can include writing static information to blocks that have high erase counts to prolong the life of the block.

Figure 2:
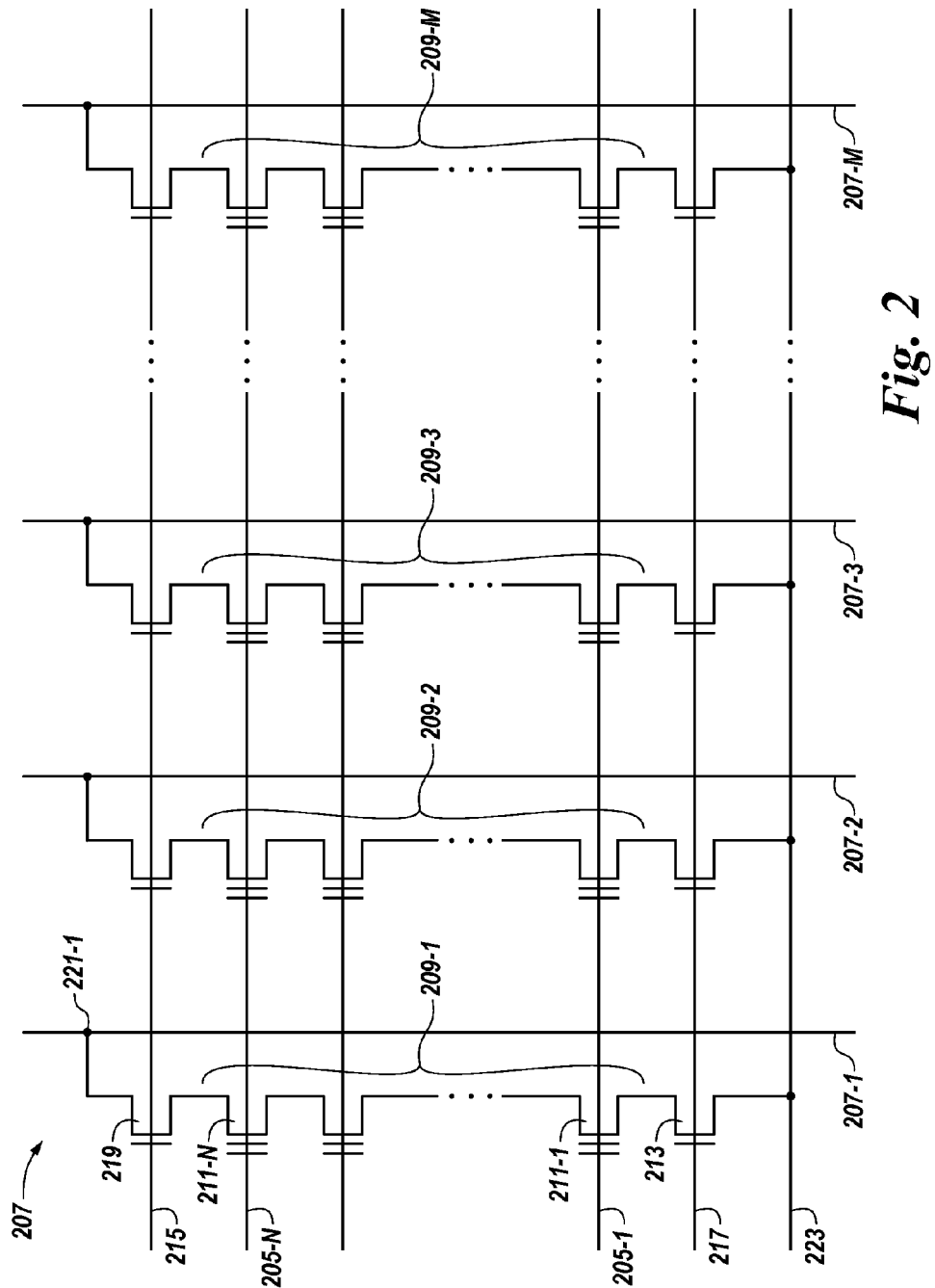
FIG. 2 illustrates a schematic diagram of a portion of a non-volatile memory array in accordance with a number of embodiments of the present disclosure.

FIG. 2 illustrates a schematic diagram of a portion of a non-volatile memory array in accordance with a number of embodiments of the present disclosure. The memory array can be contained within the memory devices 110-1, . . . , 110-N illustrated in FIG. 1. The embodiment of FIG. 2 illustrates a NAND architecture non-volatile memory array. However, embodiments described herein are not limited to this example. As shown in FIG. 2, the memory array 201 includes access lines (e.g., word lines 205-1, . . . , 205-N) and intersecting data lines (e.g., local bit lines 207-1, 207-2, 207-3, . . . , 207-M). For ease of addressing in the digital environment, the number of word lines 205-1, . . . , 205-N and the number of local bit lines 207-1, 207-2, 207-3, . . . , 207-M can be some power of two (e.g., 256 word lines by 4,096 bit lines).

Memory array 201 includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . , 207-M. The memory cells 211-1, . . . , 211-N of each NAND string 209-1, 209-2, 209-3, . . . , 209-M are coupled in series source to drain between a source select gate (SGS) (e.g., a field-effect transistor (FET) 213) and a drain select gate (SGD) (e.g., FET 219). Each source select gate 213 is configured to selectively couple a respective NAND string to a common source 223 responsive to a signal on source select line 217, while each drain select gate 219 is configured to selectively couple a respective NAND string to a respective bit line responsive to a signal on drain select line 215.

As shown in the embodiment illustrated in FIG. 2, a source of source select gate 213 is coupled to a common source line 223. The drain of source select gate 213 is coupled to the source of the memory cell 211-1 of the corresponding NAND string 209-1. The drain of drain select gate 219 is coupled to bit line 207-1 of the corresponding NAND string 209-1 at drain contact 221-1. The source of drain select gate 219 is coupled to the drain of the last memory cell 211-N (e.g., a floating-gate transistor) of the corresponding NAND string 209-1.

In a number of embodiments, construction of the non-volatile memory cells 211-1, . . . , 211-N includes a source, a drain, a floating gate or other charge storage structure, and a control gate. The memory cells 211-1, . . . , 211-N have their control gates coupled to a word line, 205-1, . . . , 205-N, respectively. A NOR array architecture would be similarly laid out, except that the string of memory cells would be coupled in parallel between the select gates. Furthermore, a NOR architecture can provide for random access to the memory cells in the array (e.g., as opposed to page-based access as with a NAND architecture).

A number (e.g., a subset or all) of cells coupled to a selected word line (e.g., 205-1, . . . , 205-N) can be written and/or read together as a group. A number of cells written and/or read together can correspond to a page of data. As used herein, examples of high-level operations are referred to as writing or reading operations (e.g., from the perspective of a controller), whereas, with respect to the memory cells, such operations are referred to as programming or sensing. A group of cells coupled to a particular word line and programmed together to respective states can be referred to as a target page. A programming operation can include applying a number of program pulses (e.g., 16V-20V) to a selected word line in order to increase the threshold voltage (Vt) of selected cells coupled to that selected word line to a desired program voltage level corresponding to a targeted state.

In a number of embodiments, a programming operation can be modified by selecting a number of pages of memory cells, such as the pages of the memory cells that were being programmed by a programming operation that was interrupted. The number of pages of memory cells can be selected by setting data latches to accept a programming signal, e.g., place cells in the uninhibited state and set them for active program. A programming signal that programs the pages of memory cells to an uncorrectable data state can be applied to the memory cells. The programming signal can be applied to pages of memory cells that had completed and/or were in the process of completing a lower page programming operation, a middle page programming operation, and/or an upper page programming operation, among other programming operation types. In a number of embodiments, the programming signal can be modified to program pages of the memory cells to a data state corresponding to the highest data state of an upper page programming operation and/or to a data state that will be recognized by the controller as being uncorrectable.

In a number of embodiments, a modified programming operation can only select pages of memory cells for programming used the modified programming signal that do not have an upper page flag programmed. The pages that have an upper page flag programmed have completed the programming operation and are not at risk of their memory cells being at unintended data state, therefore the memory cells do not need to be intentionally corrupted via the modified programming operation.

Figure 3:
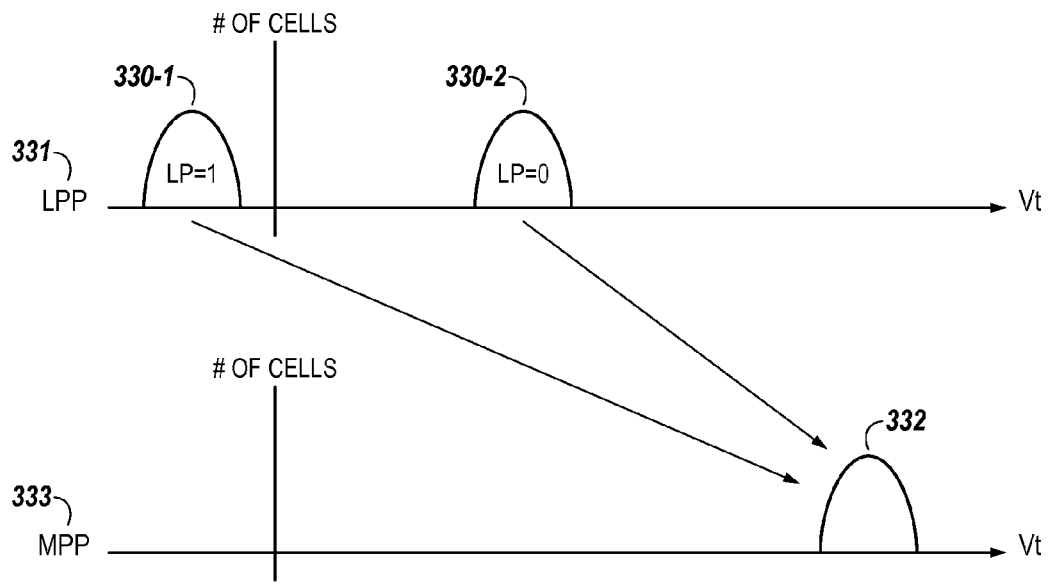
FIG. 3 illustrates a diagram of voltage threshold distributions of memory cells based on programming interruption management in accordance with a number of embodiments of the present disclosure.

FIG. 3 illustrates a diagram of voltage threshold distributions of memory cells based on programming interruption management in accordance with a number of embodiments of the present disclosure. The apparatuses and methods described thus far can be applied to single digit and multi-digit memory cells. In the example illustrated in FIG. 3, the memory cells are 2-bit memory cells with each cell being programmable to one of four data states (e.g., L1 to L4) each indicating a different 2-bit stored bit pattern (e.g., 11, 01, 10, 00). In a number of embodiments, each of the bits in the 2-bit stored bit pattern corresponds to a different page of data. For instance, the least significant bit (LSB) (right most bit shown as boxed in FIG. 2) can contribute to a first page of data (e.g., a lower page of data) and the most significant bit (MSB) (left most bit shown as surrounded by diamond symbol in FIG. 4) can contribute to a second page of data (e.g., an upper page of data). As such, a page of cells can store two pages of data, in this example.

However, embodiments are not limited to multilevel memory cells storing two bits of data. For instance, a number of embodiments can include memory cells configured to store more or fewer than two bits of data and/or a fractional number of bits of data. Also, embodiments are not limited to the particular bit values assigned to the data states L1 to L4.

Figure 4:
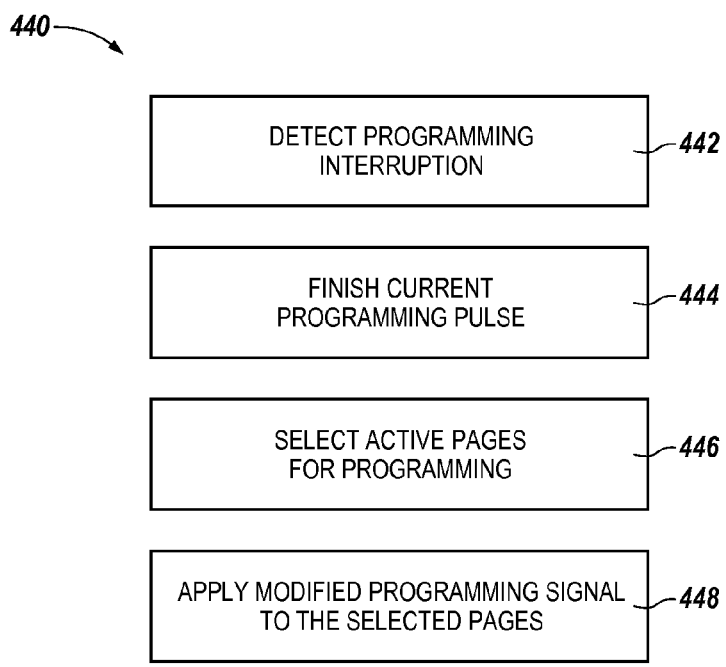
FIG. 4 is a flow chart illustrating a method of programming interruption management in accordance with a number of embodiments of the present disclosure.

The diagram shown in FIG. 4 illustrates threshold voltage (Vt) distributions of a number of cells after a lower page programming (LPP) process 431 and after a modified programming process according to embodiments of the present disclosure. NAND flash memory cells can be erased prior to having new data programmed thereto.

As part of the LPP process 331, the Vt of the memory cells are adjusted (e.g., via programming pulses applied to a selected word line) to one of two levels represented by Vt distributions 330-1 and 330-2. The voltage levels are represented by Vt distributions, which can reflect a statistical average Vt level of cells programmed to a particular level. In this example, memory cells whose lower page is to store a bit value of "1" (e.g., LP=1) are programmed to distribution 430-1 during LPP process 331, and cells whose lower page is to store a bit value of "0" (e.g., LP=0) are programmed to distribution 330-2 during LPP process 431.

When a programming interruption is detected, as part of the modified programming process 333, the Vt of the memory cells are adjusted a level represented by Vt distributions 332. In this example, the memory cells can be programmed to a level that corresponds to the L4 data state. In a number of embodiments, the memory cells can be programmed to a level that is sufficiently high for the controller to identify that they are corrupt and/or uncorrectable. When all of the cells on a page are programmed to the L4 data state, e.g., the 00 data state, the controller recognizes the data on the page as corrupt and/or as being in an uncorrectable data state, e.g, UECC, where error correction processes will not be able to recover the data.

In a number of embodiments, the modified programming process can include providing the modified programming signal to memory cells that have undergone an upper page programming process and/or a middle page programming process, among other programming processes.

FIG. 4 is a flow chart illustrating a method 440 of programming interruption management in accordance with a number of embodiments of the present disclosure. At 442, a programming interruption can be detected. A programming interruption can be detected via a signal toggle using a number of settings and/or trims in a controller. For example, a write protect pin can act as the signal toggle and when a signal on the write protect pin is below the a threshold voltage, a programming interruption can be detected. In a number of embodiments, a programming interruption can be an event that will cause a programming operation to prematurely end. For example, an unexpected power loss can be a programming interruption.

At 444, in response to detecting a programming interruption, the programming operation can finish the current programming pulse that is being applied to the memory cells. At 446, the active pages of the programming operation are selected. The active pages can be pages of memory cells that were being programmed with a lower page programming process by the programming operation. The active pages can be selected by setting the data latches of the active pages to accept a programming signal.

At 448, a modified programming signal can be applied to the selected pages. The modified programming signal can be a signal that programs the selected pages to an uncorrectable data state. The uncorrectable state can be a data pattern that the controller recognizes as an undesirable data pattern that is corrupt.

The present disclosure is related to programming interruption management. An apparatus can be configured to detect an interruption during a programming operation and modify the programming operation to program a portion of the memory array to an uncorrectable state in response to detecting the interruption.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment.

Thus, the following claims are hereby incorporated into the Detailed Description, with each claim standing on its own as a separate embodiment.

What is claimed is:

1. An apparatus, comprising:
  a memory array; and
  a controller configured to:
  detect an interruption during a programming operation by detecting signal toggle using a number of trims set in the controller; and
  modify the programming operation to program a portion of the memory array to an uncorrectable state in response to detecting the interruption.

2. The apparatus of claim 1, wherein the controller is configured to detect the interruption during the programming operation by detecting a voltage drop below a threshold level.

3. The apparatus of claim 1, wherein the controller is configured to modify the programming operation by setting data latches on all active pages to accept a programming signal.

4. The apparatus of claim 3, wherein the controller is configured to modify the programming operation by providing the programming signal to program all memory cells of the active pages.

5. The apparatus of claim 3, wherein the controller is configured to detect and flag each of the pages programmed to the uncorrectable state as being programmed during the interruption in the programming operation.

6. The apparatus of claim 1, wherein the controller is configured to move data from the block having the pages programmed to the uncorrectable state to a new block.

7. The apparatus of claim 1, wherein the controller is configured to detect pages programmed to the uncorrectable state as being corrupt.

8. A method for managing a programming interruption, comprising:
  detecting an interruption in a programming operation by detecting signal toggle using a number of trims set in the controller; and
  modifying the programming operation in response to detecting the interruption in the programming operations by providing a modified programming signal that programs active pages of the programming operation to an uncorrectable state.

9. The method of claim 8, wherein providing the modified programming signal programs memory cells that have completed a lower page programming process to the uncorrectable state.

10. The method of claim 8, wherein the method includes detecting the active pages programmed to the uncorrectable state as corrupted and moving data from pages on block containing the active pages programmed to the uncorrectable state to a new block.

11. The method of claim 8, wherein the method includes selecting active pages of the programming operation by setting data latches of the active pages to accept the modified programming signal.

12. The method of claim 8, wherein detecting the interruption in the programming operation includes detecting a signal toggle that indicates the programming operation cannot be completed.

13. The method of claim 8, wherein detecting the interruption in the programming operation includes detecting a power loss.

14. A method for managing a programming interruption, comprising:
  detecting an interruption in a programming operation by detecting a signal toggle using a number of trims set in the controller;
  setting data latches for active pages of the programming operations to accept a programming signal; and
  applying a programming signal to memory cells of the active pages, wherein the programming signal programs the memory cells of the active pages to an uncorrectable state.

15. The method of claim 14, wherein applying the programming signal includes applying the programming signal that corresponds to the highest voltage threshold state for the memory cells of the active pages.

16. The method of claim 14, wherein applying the programming signal causes a programming pattern of the programming operation to be lost.

17. The method of claim 14, wherein the method includes intentionally corrupting the active pages by applying the programming signal.

18. The method of claim 14, wherein detecting the interruption in the programming operation includes detecting a signal toggle that indicates the programming operation will be prematurely terminated.

19. The method of claim 14, wherein detecting the interruption in the programming operation includes detecting a power loss.

20. An apparatus, comprising:
  a memory array; and
  a controller configured to:
  detect an interruption in a programming operation by detecting a signal toggle using a number of trims set in the controller;
  apply a programming signal to memory cells of the memory array that programs the memory cells to an uncorrectable state.

21. The apparatus of claim 20, wherein the controller is configured to set data latches for active pages of the programming operations to accept the programming signal.

22. The apparatus of claim 20, wherein the controller is configured to detect the uncorrectable state of the memory cells by detecting a number of errors that is greater than which can be corrected by an error correction (ECC) operation.

23. The apparatus of claim 20, wherein the controller is configured to modify the programming operation by providing the programming signal to program the lower page of the memory cells.

24. The apparatus of claim 20, wherein the controller is configured to skip applying the programming signal to a number of pages that include an upper page flag indicating that an upper page programming operation has been performed.

25. A method for managing a programming interruption, comprising:
  detecting an interruption in a programming operation via a signal toggle; and
  intentionally corrupting a number of pages of memory cells to an uncorrectable state in response to detecting the interruption.

26. The method of claim 25, wherein detecting the interruption in the programming operation includes detecting that a signal drops below a threshold voltage.

27. The method of claim 25, wherein intentionally corrupting the number of pages of memory cells includes applying a modified programming signal to the number of pages of memory cells that programs the number of pages of memory cells to an uncorrectable data state.

28. The method of claim 25, including intentionally corrupting the number of pages of memory cells that were undergoing a lower page programming operation when the interruption occurred.

29. The method of claim 25, including intentionally corrupting the number of pages of memory cells that were undergoing an upper page programming operation when the interruption occurred.

30. The method of claim 25, including moving data from a block containing the corrupt number of pages of memory cells using a wear leveling operation.

* * * * *